United States Patent
Kitamura et al.

(10) Patent No.: US 6,943,045 B2
(45) Date of Patent: Sep. 13, 2005

(54) SEMICONDUCTOR WAFER PROTECTIVE DEVICE AND SEMICONDUCTOR WAFER TREATMENT METHOD

(75) Inventors: Masahiko Kitamura, Tokyo (JP); Masatoshi Nanjo, Tokyo (JP); Kouichi Yajima, Tokyo (JP); Shinichi Namioka, Tokyo (JP)

(73) Assignee: Disco Corporation, Tokyo (JP)

( * ) Notice: Subject to any disclaimer, the term of this patent is extended or adjusted under 35 U.S.C. 154(b) by 153 days.

(21) Appl. No.: 10/468,452

(22) PCT Filed: Feb. 27, 2003

(86) PCT No.: PCT/JP03/02194
§ 371 (c)(1),
(2), (4) Date: Aug. 20, 2003

(87) PCT Pub. No.: WO2004/036642
PCT Pub. Date: Apr. 29, 2004

(65) Prior Publication Data
US 2004/0235269 A1 Nov. 25, 2004

(30) Foreign Application Priority Data
Oct. 18, 2002 (JP) .................................... 2002-304454

(51) Int. Cl.[7] .............................................. H01L 21/66
(52) U.S. Cl. ...................................................... 438/17
(58) Field of Search ........................ 438/17, 3, 4, 455, 438/459, 460, 464

(56) References Cited

U.S. PATENT DOCUMENTS

| | | | | |
|---|---|---|---|---|
| 3,681,139 A | * | 8/1972 | Jannett et al. | 156/344 |
| 3,783,499 A | * | 1/1974 | Hughes et al. | 438/3 |
| 3,809,233 A | * | 5/1974 | Gruszka | 206/722 |
| 4,041,944 A | * | 8/1977 | Rhodes | 604/6.1 |
| 4,071,944 A | * | 2/1978 | Chuss et al. | 438/17 |
| 4,883,773 A | * | 11/1989 | Ishikura | 438/3 |
| 6,841,030 B2 | * | 1/2005 | Sasada | 156/344 |
| 2002/0055238 A1 | | 5/2002 | Sugino et al. | |
| 2004/0072520 A1 | * | 4/2004 | Kitamura | 451/386 |

FOREIGN PATENT DOCUMENTS

| | | |
|---|---|---|
| EP | 1 195 809 | 4/2002 |
| JP | 5-114643 | 5/1993 |
| JP | 7-78864 | 3/1995 |
| JP | 2002-59363 | 2/2002 |
| JP | 2002-75921 | 3/2002 |
| JP | 2002-348554 | 12/2002 |

OTHER PUBLICATIONS

Notice Informing the Applicant of the Communication of the International Application to the Designated Offices (Form PCT/IB/308) issued in connection with PCT/JP2003/002194 (Apr. 2002).

* cited by examiner

Primary Examiner—Michael Lebentritt
Assistant Examiner—Andre'Stevenson
(74) Attorney, Agent, or Firm—Smith, Gambrell & Russell, LLP

(57) ABSTRACT

A semiconductor wafer protecting unit which enables a semiconductor wafer to be handled as required, without breakage of the semiconductor wafer, even when the back of the semiconductor wafer is ground to decrease the thickness of the semiconductor wafer markedly; and a semiconductor wafer processing method using such a semiconductor wafer protecting unit. The semiconductor wafer protecting unit is composed of a magnetized tape having one surface with tackiness, and a magnetic substrate having many pores formed at least in a central zone thereof.

11 Claims, 6 Drawing Sheets

SEMICONDUCTOR WAFER PROTECTIVE DEVICE AND SEMICONDUCTOR WAFER TREATMENT METHOD

TECHNICAL FIELD

This invention relates to a semiconductor protecting unit for use in applying required machining, such as back grinding, to a semiconductor wafer, and a semiconductor wafer processing method using such a semiconductor protecting unit.

BACKGROUND ART

For production of a semiconductor chip, as is well known among people skilled in the art, many rectangular regions are demarcated by streets arranged in a lattice pattern on the face of a semiconductor wafer, and a semiconductor circuit is applied in each of the rectangular regions. Normally, the back of the semiconductor wafer is ground to decrease the thickness of the semiconductor wafer, and then the semiconductor wafer is cut along the streets to separate the rectangular regions individually, thereby forming semiconductor chips. Recently, a method has been carried out in which prior to grinding of the back of the semiconductor wafer, grooves of a required depth are formed along the streets on the face of the semiconductor wafer, and then the back of the semiconductor wafer is ground to make the thickness of the semiconductor wafer not more than the depth of the grooves, whereby the rectangular regions are separated individually to form semiconductor chips. In either method, when the back of the semiconductor wafer is to be ground, a tape is stuck to the face of the semiconductor wafer in order to protect the semiconductor circuits. With the tape-bearing face being pointed downward, namely, with the face and the back being inverted, the semiconductor wafer is held on chuck means, and grinding means is caused to act on the back of the semiconductor wafer. Holding of the semiconductor wafer by the chuck means is performed by vacuum attraction, which is a method involving the formation of a holding zone of the chuck means from a porous material, and suction through the holding zone.

To form a very compact, lightweight semiconductor chip, it has recently been often desired that the thickness of the semiconductor wafer be markedly decreased, for example, to 100 $\mu$m or less, especially 50 $\mu$m or less. If the thickness of the semiconductor wafer is very small, however, the rigidity of the semiconductor wafer also becomes so low as to pose considerable difficulty in handling the semiconductor wafer, for example, transporting the semiconductor wafer from the top of the chuck means into a cassette container. This transportation of the semiconductor wafer can be carried out, if a tape with relatively high rigidity, e.g. a relatively thick polyethylene terephthalate film or sheet, is used as a tape to be stuck to the face of the semiconductor wafer via a suitable pressure sensitive adhesive. Sticking of the tape with relatively high rigidity to the face of the semiconductor wafer, however, makes it considerably difficult to peel the tape from the face of the semiconductor wafer without damaging the semiconductor wafer.

DISCLOSURE OF THE INVENTION

It is, therefore, a first object of the present invention to provide a novel and excellent semiconductor wafer protecting unit which enables a semiconductor wafer to be handled as required, without breakage of the semiconductor wafer, even when the back of the semiconductor wafer is ground to decrease the thickness of the semiconductor wafer markedly.

A second object of the present invention is to provide a semiconductor wafer processing method using the above semiconductor protecting unit.

According an aspect of the present invention, there is provided, as a semiconductor wafer protecting unit for attaining the first object, a semiconductor wafer protecting unit composed of a magnetized tape having one surface with tackiness, and a magnetic substrate having many pores formed at least in a central zone thereof. The wording "magnetized tape" as used herein refers to a tape which contains a permanent magnet and generates a magnetic field.

According to another aspect of the present invention, there is provided, as a semiconductor wafer processing method for attaining the second object, a semiconductor wafer processing method including grinding the back of a semiconductor wafer, in which many rectangular regions have been demarcated by streets arranged in a lattice pattern on the face of the semiconductor wafer and a circuit has been applied in each of the demarcated regions, the method comprising:

sticking one surface of a magnetized tape of a semiconductor wafer protecting unit, which is composed of the magnetized tape having the one surface with tackiness, and a magnetic substrate having many pores formed at least in a central zone thereof, to the face of the semiconductor wafer; and attracting the other surface of the magnetized tape magnetically to the magnetic substrate, thereby mounting the semiconductor wafer on the magnetic substrate via the magnetized tape;

vacuum attracting the magnetic substrate having the semiconductor wafer mounted thereon to an upper surface of chuck means to mount the semiconductor wafer on the chuck means, with the back of the semiconductor wafer being exposed; and grinding the back of the semiconductor wafer mounted on the chuck means by grinding means.

The magnetized tape in the semiconductor protecting unit is preferably formed from a plastic tape having a magnet powder coated thereon or incorporated therein, and a pressure sensitive adhesive layer coated on one surface of the plastic tape. Preferably, the substrate includes a frame zone surrounding the central zone, and no pores are formed in the frame zone. It is preferred that the area rate of the pores in the central zone of the substrate is 1 to 50%, the diameter of the pores is 0.1 to 0.5 mm, and the substrate is 0.2 to 0.5 mm in thickness and comprises an iron-based alloy consisting essentially of iron or a nickel-based alloy consisting essentially of nickel.

The semiconductor wafer processing method preferably further includes detaching the magnetic substrate, the magnetized tape and the semiconductor wafer from the chuck means after grinding the back of the semiconductor wafer; sticking the back of the semiconductor wafer to a mounting tape stuck to a mounting frame having a mounting opening at the center thereof, with the mounting tape straddling the mounting opening, thereby mounting the semiconductor wafer, the magnetized tape and the magnetic substrate within the mounting opening of the mounting frame; and detaching the magnetic substrate and the magnetized tape from the face of the semiconductor wafer mounted on the mounting frame. The semiconductor wafer processing method preferably further includes applying a die attach film to the back of the semiconductor wafer after detaching the magnetic substrate, the magnetized tape and the semiconductor wafer from the chuck means, and before mounting the semiconductor wafer, the magnetized tape and the magnetic substrate within the mounting opening of the mounting frame.

BEST MODE FOR CARRYING OUT THE INVENTION

Preferred embodiments of the present invention will be described in greater detail by reference to the accompanying drawings.

Figure 1:
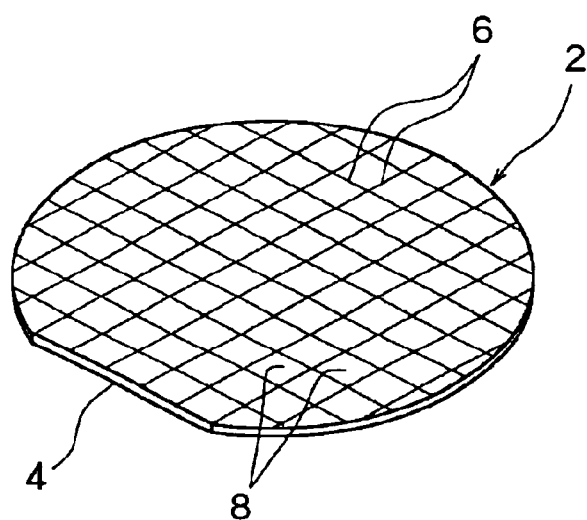
FIG. 1 is a perspective view showing a typical example of a semiconductor wafer.

FIG. 1 shows a typical example of a semiconductor wafer. The illustrated semiconductor wafer, 2, is of a shape having a linear edge 4 (called an orientation flat) formed in part of a disk shape. On the face of the semiconductor wafer 2, many rectangular regions 8 have been demarcated by streets 6 arranged in a lattice pattern. A semiconductor circuit has been created in each of the rectangular regions 8.

Figure 2:
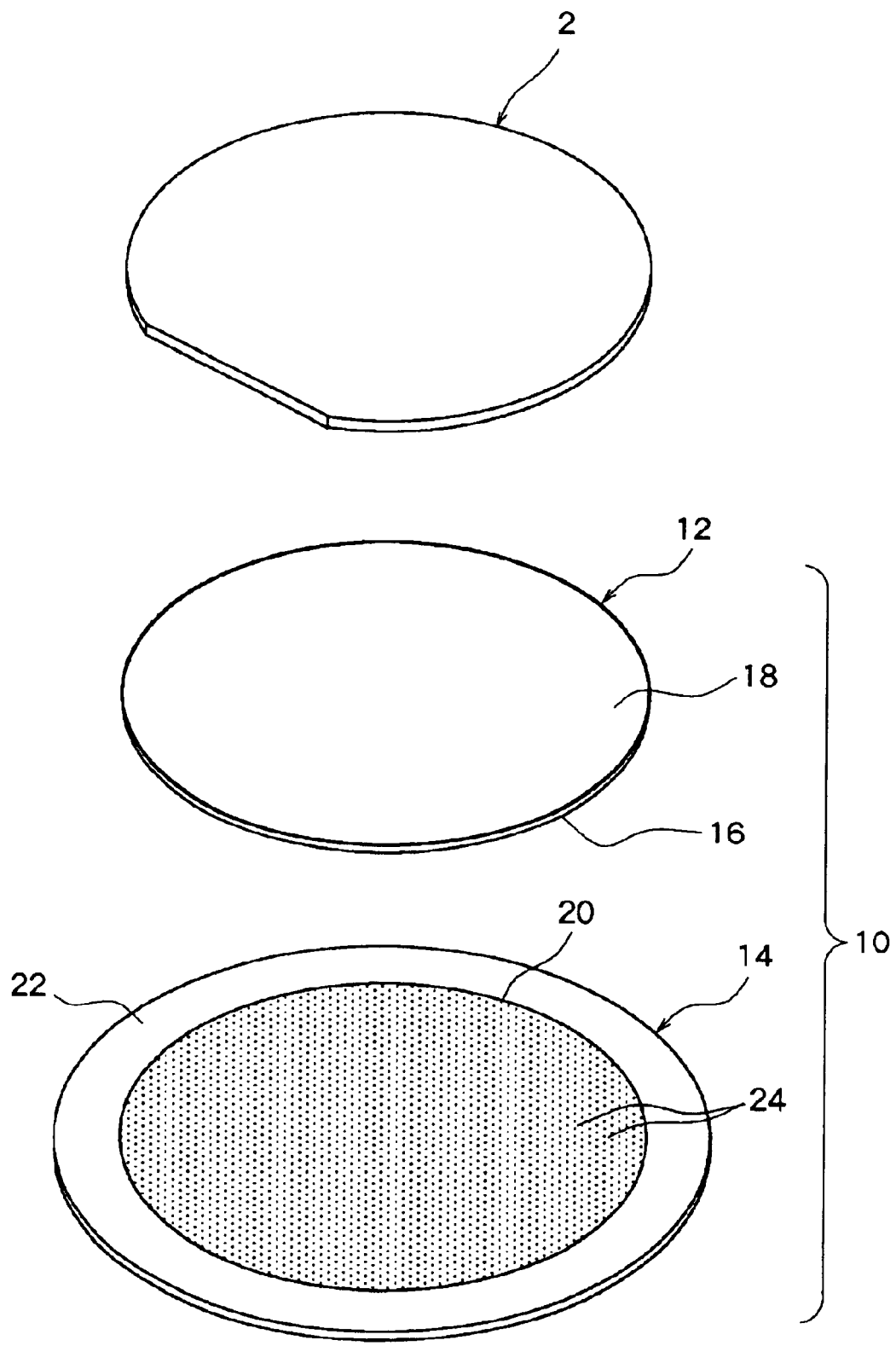
FIG. 2 is a perspective view for illustrating the steps of applying a semiconductor protecting unit composed of a magnetized tape and a magnetic substrate to the semiconductor wafer.
Figure 3:
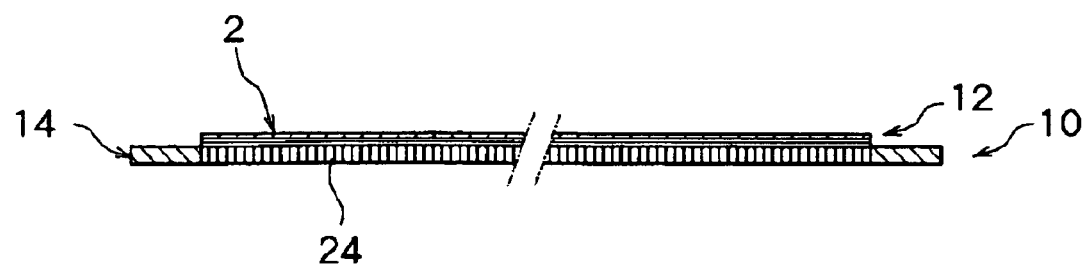
FIG. 3 is a sectional view showing a state of the semiconductor wafer mounted on the magnetic substrate via the magnetized tape.

With reference to FIG. 2 along with FIG. 1, according to the present invention, a semiconductor protecting unit, entirely indicated at 10, is applied to the semiconductor wafer 2 before the back of the semiconductor wafer 2 is ground to decrease the thickness of the semiconductor wafer 2. The semiconductor protecting unit 10 includes a magnetized tape 12 and a magnetic substrate 14. The magnetized tape 12 in the illustrated embodiment is constituted such that a pressure sensitive adhesive layer 18 is formed by applying a pressure sensitive adhesive to the face (upper surface in FIG. 3) of a magnetized plastic tape 16 which can be formed by coating a magnet powder to the back (lower surface in FIG. 3) of a plastic tape with relatively low rigidity, such as a polyolefin film or sheet, or by incorporating a magnet powder into the plastic tape. The pressure sensitive adhesive constituting the pressure sensitive adhesive layer 18 may be a pressure sensitive adhesive well known per se which, for example, is decreased in tackiness by exposure to ultraviolet radiation. Since the pressure sensitive adhesive layer 18 has been applied to the face, i.e. one surface, of the magnetized tape 12, the one surface of the magnetized tape 12 has tackiness. The shape of the magnetized tape 12 is a disk shape corresponding to the shape of the semiconductor wafer 2. A linear edge corresponding to the linear edge 4 of the semiconductor wafer 2 is not formed in the illustrated magnetized tape 12. If desired, however, a linear edge can be formed in the magnetized tape 12 as well.

The illustrated magnetic substrate 14 is disk-shaped as a whole, and has a circular central zone 20 and an annular frame zone 22. The central zone 20 has a diameter corresponding to the diameter of the magnetized tape 12. Many pores 24 are formed in the central zone 20. It is preferred that the area rate of the pores 24 in the central zone 20 is 1 to 50%, and the diameter of the pores 24 is 0.1 to 0.5 mm. No pores are formed in the frame zone 22, and the frame zone 22 is solid. Preferably, the magnetic substrate 12 of this construction can be formed from a suitable magnetic material, and comprises an iron-based alloy consisting essentially of iron or a nickel-based alloy consisting essentially of nickel. The thickness of the magnetic substrate 12 is preferably about 0.2 to 0.5 mm.

The magnetized tape 12 is stuck to the face of the semiconductor wafer 2 by having its tacky surface (upper surface in FIG. 3) brought into intimate contact with the face of the semiconductor wafer 2. The magnetic substrate 14 is magnetically attracted to the other surface (lower surface in FIG. 3) of the magnetized tape 12, with its central zone 20 in alignment with the magnetized tape 12. In this manner, the semiconductor wafer 2 is mounted on the magnetic substrate 14 via the magnetized tape 12.

Figure 4:
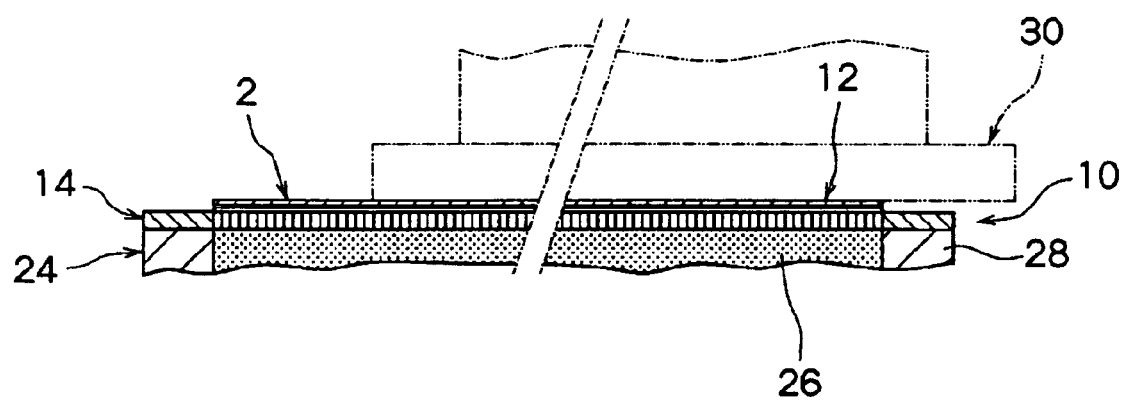
FIG. 4 is a sectional view showing a state of the back of the semiconductor wafer being ground.

With reference to FIG. 4, chuck means 24 is disposed in a grinder which is preferably used for grinding the back of the semiconductor wafer 2, for example, a grinder sold by Disco Corporation, Japan, under the trade name of "DFG 841". The chuck means 24 has a porous central member 26 in the form of a disk, and an annular casing 28 surrounding the central member 26. The diameter of the central member 26 fixed within the annular casing 28 corresponds to the diameter of the central zone 20 of the magnetic substrate 14. The upper surfaces of the central member 26 and the annular casing 28 are coplanar.

In grinding the back of the semiconductor wafer 2, as illustrated in FIG. 4, the magnetic substrate 14 mounted with the semiconductor wafer 2 via the magnetized tape 12 is placed on the chuck means 24, with the central zone 20 of the magnetic substrate 14 being aligned with the central member 26 of the chuck means 24. Then, the central member 26 is connected to a vacuum source (not shown), whereby atmospheric air is sucked through the central zone 20 of the magnetic substrate 14 and the central member 26 of the chuck means 24. As a result, the semiconductor wafer 2 is vacuum attracted onto the chuck means 24 via the magnetized tape 12. Then, the back of the semiconductor wafer 2, exposed upward, is ground by grinding means 30. The grinding means 30 is composed of an annular grinding tool, and a grinding piece containing diamond grains is disposed on the lower surface of the grinding tool. The chuck means 24 having the semiconductor wafer 2 attracted thereto is rotated about its central axis, and the grinding means 30 is also rotated about its central axis. The grinding means 30 is pressed against the back of the semiconductor wafer 2 to grind the back of the semiconductor wafer 2.

Figure 5:
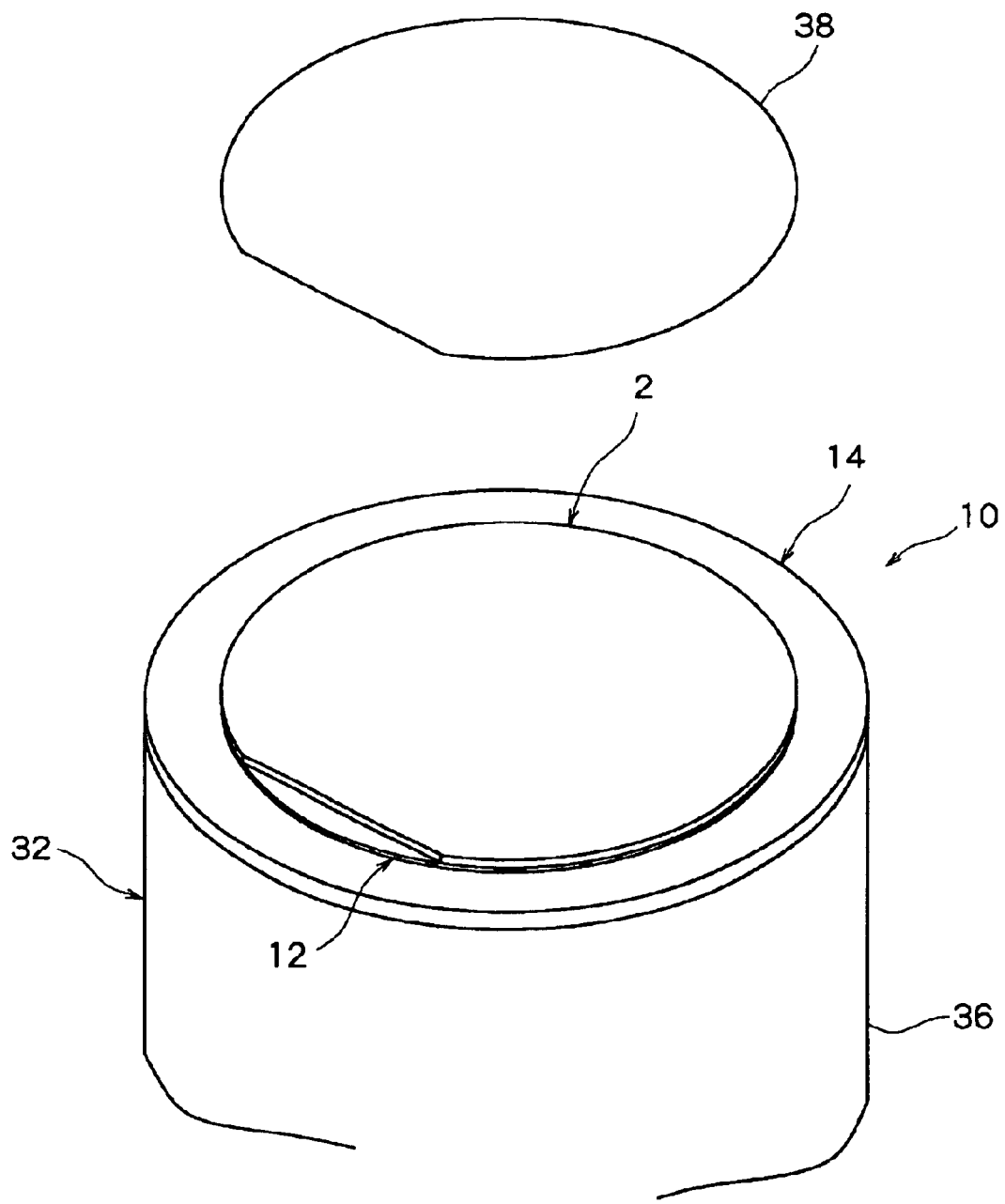
FIG. 5 is a perspective view for illustrating the step of sticking a die attach tape to the back of the semiconductor wafer.

After the back of the semiconductor wafer 2 is ground as required, the chuck means 24 is cut off from the vacuum source to release the sucking action of the chuck means 24. The magnetic substrate 14 and the semiconductor wafer 2 mounted on the magnetic substrate 14 via the magnetized tape 12 are detached from the top of the chuck means 24. Detachment of the semiconductor wafer 2 from the top of the chuck means 24, and transport of the detached semiconductor wafer 2 can be performed while the magnetic substrate 14 is being gripped. Thus, even if the semiconductor wafer 2 is markedly thinned, the detachment and transport operations can be carried out without damage to the semiconductor wafer 2. In the illustrated embodiment, as shown in FIG. 5, the magnetic substrate 14, the magnetized tape 12 and the semiconductor wafer 2, which have been detached, are placed on chuck means 32, with the magnetic substrate 14 being lowermost. Like the chuck means 24, the chuck means 32 has a central member (not shown) 34 in the form of a disk, and an annular casing 36 surrounding the central member. The diameter of the central member fixed within the annular casing 36 corresponds to the diameter of the central zone 20 of the magnetic substrate 14. The upper surfaces of the central member and the annular casing 36 are coplanar. Heating means (not shown), which may be an electric resistance heater, is disposed within the annular casing 36.

With further reference to FIG. 5, when the magnetic substrate 14, the magnetized tape 12 and the semiconductor wafer 2 are to be placed on the chuck means 32, the heating means is actuated to heat the central member 34 to about 80~200° C. Then, the central member is connected to a vacuum source (not shown), whereby atmospheric air is sucked through the central zone 20 of the magnetic substrate 14 and the central member of the chuck means 32. As a result, the semiconductor wafer 2 is attracted onto the chuck means 32 via the magnetized tape 12. Then, one surface of a die attach tape 38 well known per se is brought into intimate contact with the back of the semiconductor wafer 2 exposed upward, whereby the die attach tape 38 is stuck to the back of the semiconductor wafer 2. The die attach tape 38 may be of substantially the same shape as that of the semiconductor wafer 2. Then, the action of the heating means is stopped to cool the semiconductor wafer 2 and the die attach tape 38 to room temperature.

Figure 6:
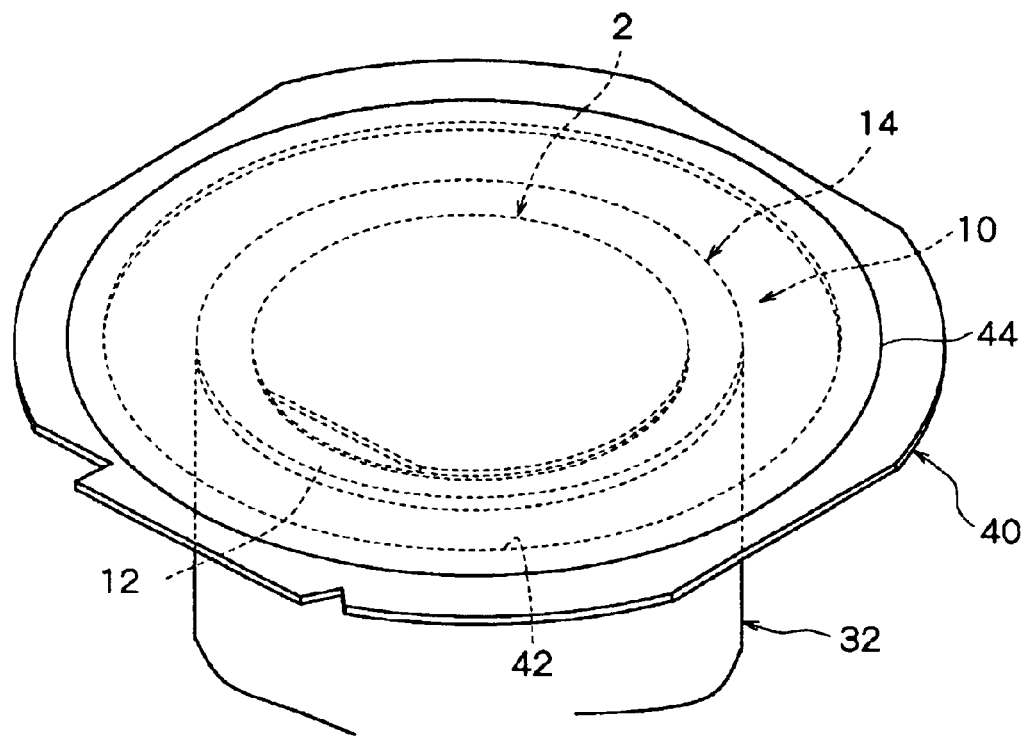
FIG. 6 is a perspective view for illustrating the step of mounting the semiconductor wafer on a mounting frame.
Figure 7:
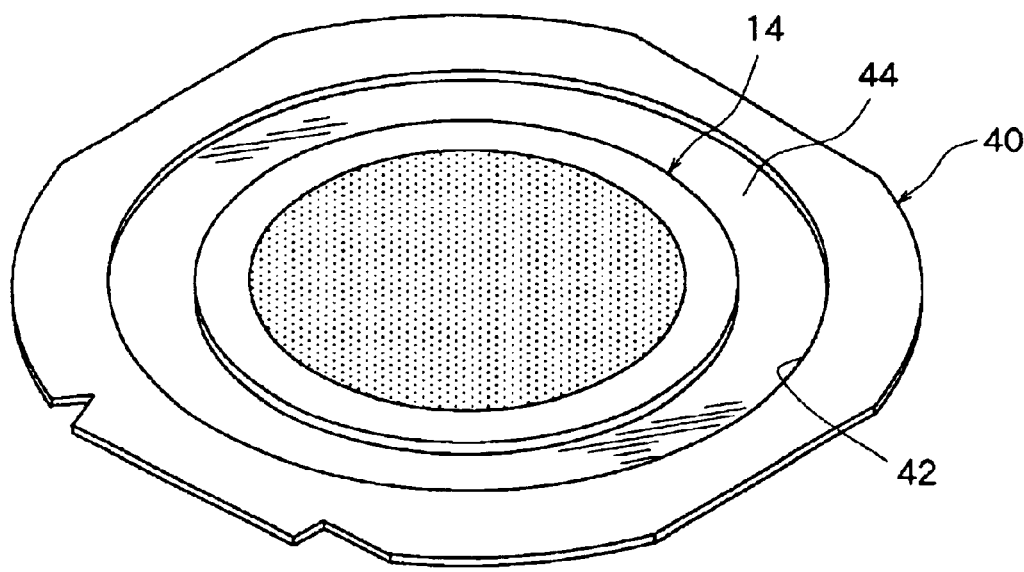
FIG. 7 is a perspective view showing a state in which the semiconductor wafer mounted on the magnetic substrate via the magnetized tape is mounted on the mounting frame.

In the illustrated embodiment, as shown in FIG. 6, a mounting frame 40 is further mounted on the back of the semiconductor wafer 2 held on the chuck means 32. The mounting frame 40, which can be formed from a suitable thin metal plate or synthetic resin, has a relatively large mounting opening 42 at the center thereof. A mounting tape 44 is stuck to one surface (upper surface in FIG. 6) of the mounting frame 40 in such a manner as to straddle the mounting opening 42. One surface (lower surface in FIG. 6) of the mounting tape 44 has tackiness. The back of the semiconductor wafer 2 is located within the mounting opening 42 of the mounting frame 40, and the mounting tape 44 is stuck to the back of the semiconductor wafer 2. Thus, the mounting frame 40 is connected to the back of the semiconductor wafer 2 via the mounting tape 44, so that the semiconductor wafer 2, the magnetized tape 12 and the magnetic substrate 14 are mounted on the mounting frame 40 via the mounting tape 44. FIG. 7 shows a state in which the mounting frame 40, the mounting tape 44, the semiconductor wafer 2, the magnetized tape 12 and the magnetic substrate 14, combined integrally, have been detached from the top of the chuck means 32, and the face and back of this integral combination have been inverted, namely, the mounting tape 44 has been located at the lowermost position, and the magnetic substrate 14 at the uppermost position.

Figure 8:
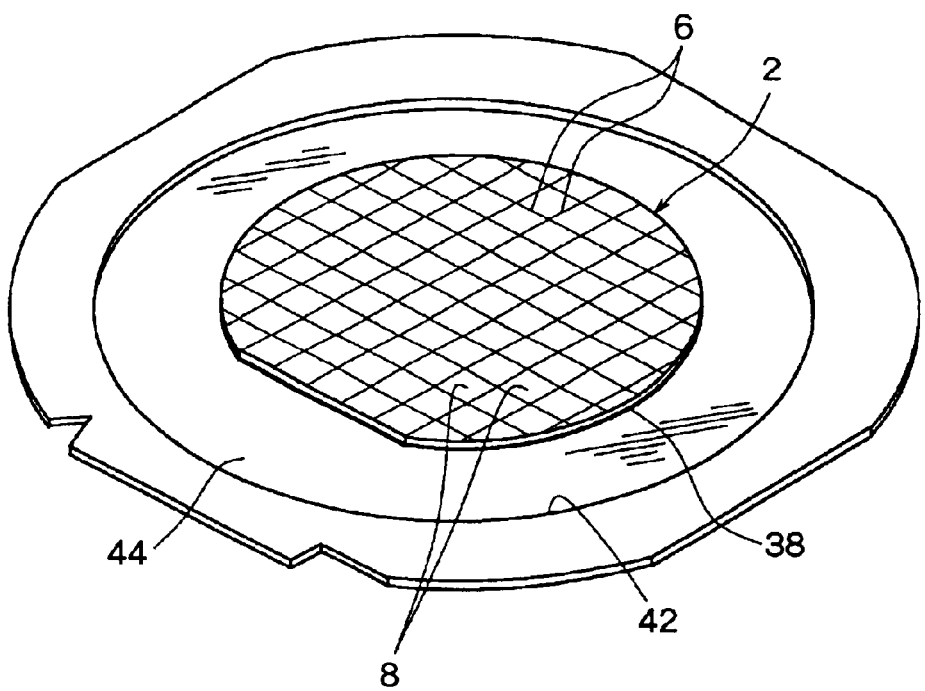
FIG. 8 is a perspective view showing a state in which the magnetized tape and the magnetic substrate have been detached from the semiconductor wafer mounted on the mounting frame.

Then, the magnetic substrate 14 is detached from the magnetized tape 12, and the magnetized tape 12 is further detached from the face of the semiconductor wafer 2. So doing achieves a state in which the semiconductor wafer 2 is mounted via the mounting tape 44 of the mounting frame 40, with the face of the semiconductor wafer 2 being exposed upward, as shown in FIG. 8. If the pressure sensitive adhesive constituting the pressure sensitive adhesive layer 18 of the magnetized tape 12 is decreased in tackiness upon exposure to ultraviolet radiation, the pressure sensitive adhesive layer 18 of the magnetized tape 12 can be exposed to ultraviolet radiation before the magnetized tape 12 is detached from the face of the semiconductor wafer 2.

As shown in FIG. 8, the semiconductor wafer 2 mounted on the mounting frame 40 via the mounting tape 44 is carried into a cutter (not shown) which may have a shape well known per se. In the cutter, the semiconductor wafer 2 is cut along the streets 6 and divided thereby into the individual rectangular regions 8. The mounting tape 44 is maintained without being cut, so that the individually divided rectangular regions 8 continue to be mounted on the mounting frame 40 via the mounting tape 44. Then, the individually divided rectangular regions 8 are carried out of the cutter, and withdrawn individually to provide semiconductor chips. The mounting frame 40 can be gripped when the semiconductor wafer 2 is carried into and out of the cutter.

What is claimed is:

1. A semiconductor wafer protecting unit composed of a magnetized tape having one surface with tackiness, and a magnetic substrate having many pores formed at least in a central zone thereof, wherein said magnetized tape is formed from a plastic tape having a magnet powder coated thereon or incorporated therein, and a pressure sensitive adhesive layer coated on one surface of said plastic tape.

2. A semiconductor wafer protecting unit composed of a magnetized tape having one surface with tackiness, and a magnetic substrate having many pores formed at least in a central zone thereof, wherein said substrate includes a frame zone surrounding said central zone, and no pores are formed in said frame zone.

3. A semiconductor wafer protecting unit according to claim 2, wherein an area rate of said pores in said central zone of said substrate is 1 to 50%, and a diameter of said pores is 0.1 to 0.5 mm.

4. A semiconductor wafer protecting unit according to claim 3, wherein said substrate is 0.2 to 0.5 mm in thickness and comprises an iron-based alloy consisting essentially of iron or a nickel-based alloy consisting essentially of nickel.

5. A semiconductor wafer processing method including grinding a back of a semiconductor wafer, in which many rectangular regions have been demarcated by streets arranged in a lattice pattern on a face of said semiconductor wafer and a circuit has been applied in each of said demarcated regions, said semiconductor wafer processing method comprising:

sticking one surface of a magnetized tape of a semiconductor wafer protecting unit, which is composed of said magnetized tape having said one surface with tackiness, and a magnetic substrate having many pores formed at least in a central zone thereof, to said face of said semiconductor wafer; and attracting other surface of said magnetized tape magnetically to said magnetic substrate, thereby mounting said semiconductor wafer on said magnetic substrate via said magnetized tape;

vacuum attracting said magnetic substrate having said semiconductor wafer mounted thereon to an upper surface of chuck means to mount said semiconductor wafer on said chuck means, with said back of said semiconductor wafer being exposed; and grinding said back of said semiconductor wafer mounted on said chuck means by grinding means.

6. A semiconductor wafer processing method according to claim 5, further comprising:

detaching said magnetic substrate, said magnetized tape and said semiconductor wafer from said chuck means after grinding said back of said semiconductor wafer;

sticking said back of said semiconductor wafer to a mounting tape stuck to a mounting frame having a mounting opening at a center thereof, with said mounting tape straddling said mounting opening, thereby mounting said semiconductor wafer, said magnetized tape and said magnetic substrate within said mounting opening of said mounting frame; and detaching said magnetic substrate and said magnetized tape from said face of said semiconductor wafer mounted on said mounting frame.

7. A semiconductor wafer processing method according to claim 6, further comprising:

applying a die attach film to said back of said semiconductor wafer after detaching said magnetic substrate, said magnetized tape and said semiconductor wafer from said chuck means, and before mounting said semiconductor wafer, said magnetized tape and said magnetic substrate within said mounting opening of said mounting frame.

8. A semiconductor wafer processing method according to claim 5, wherein said magnetized tape is formed from a plastic tape having a magnet powder coated thereon or incorporated therein, and a pressure sensitive adhesive layer coated on one surface of said plastic tape.

9. A semiconductor wafer processing method according to claim 5, wherein said substrate includes a frame zone surrounding said central zone, and no pores are formed in said frame zone.

10. A semiconductor wafer processing method according to claim 9, wherein an area rate of said pores in said central zone of said substrate is 1 to 50%, and a diameter of said pores is 0.1 to 0.5 mm.

11. A semiconductor wafer processing method according to claim 10, wherein said substrate is 0.2 to 0.5 mm in thickness and comprises an iron-based alloy consisting essentially of iron or a nickel-based alloy consisting essentially of nickel.

\* \* \* \* \*